United States Patent
Gaub et al.

(10) Patent No.: US 9,089,067 B2
(45) Date of Patent: Jul. 21, 2015

(54) MODULAR AUTOMATION SYSTEM

(75) Inventors: Gernot Gaub, Hockenheim (DE); Egon Harter, Schiltach (DE); Stefan Gutermuth, Lorsch (DE)

(73) Assignee: ABB Patent GMBH, Ladenburg (DE)

( * ) Notice: Subject to any disclaimer, the term of this patent is extended or adjusted under 35 U.S.C. 154(b) by 1339 days.

(21) Appl. No.: 11/667,843

(22) PCT Filed: Nov. 11, 2005

(86) PCT No.: PCT/EP2005/012120
§ 371 (c)(1),
(2), (4) Date: May 16, 2007

(87) PCT Pub. No.: WO2006/056327
PCT Pub. Date: Jun. 1, 2006

(65) Prior Publication Data
US 2007/0297148 A1 Dec. 27, 2007

(30) Foreign Application Priority Data

Nov. 22, 2004 (DE) .......................... 10 2004 056 243

(51) Int. Cl.
*H05K 7/00* (2006.01)
*H05K 7/14* (2006.01)
*G06F 1/18* (2006.01)

(52) U.S. Cl.
CPC ................ *H05K 7/1478* (2013.01); *G06F 1/18* (2013.01); *H05K 7/1474* (2013.01); *H05K 7/1479* (2013.01)

(58) Field of Classification Search
None
See application file for complete search history.

(56) References Cited

U.S. PATENT DOCUMENTS

| | | | | |
|---|---|---|---|---|
| 4,250,563 A | * | 2/1981 | Struger | 710/63 |
| 4,738,632 A | * | 4/1988 | Schmidt et al. | 439/341 |
| 4,845,592 A | * | 7/1989 | Himes et al. | 361/775 |
| 5,619,409 A | * | 4/1997 | Schultz et al. | 700/17 |
| 5,627,745 A | * | 5/1997 | Flood | 700/2 |
| 6,044,410 A | * | 3/2000 | Maskovyak et al. | 710/8 |
| 6,233,626 B1 | | 5/2001 | Swales et al. | |
| 6,344,975 B1 | * | 2/2002 | Gayle | 361/788 |
| 6,347,963 B1 | * | 2/2002 | Falkenberg et al. | 439/638 |

(Continued)

FOREIGN PATENT DOCUMENTS

| | | |
|---|---|---|
| DE | 36 33 785 A1 | 4/1988 |
| DE | 93 15 087.3 U1 | 1/1994 |

(Continued)

OTHER PUBLICATIONS

'Allen-Bradley I/O Modules' by Rockwell Automation, copyright 2003.*

(Continued)

*Primary Examiner* — Steven Snyder
(74) *Attorney, Agent, or Firm* — Buchanan Ingersoll & Rooney PC

(57) ABSTRACT

Modular automation system and method are disclosed. A central automation device can be constructed and upgraded using one of a plurality of selectable and variously upgradable baseboards. The automation device can be upgraded using one of a plurality of central units which have uniform external dimensions yet differing data processing power and data storage capacities. At least one input/output expansion device can be directly coupled onto the central unit. Each of the selectable baseboards has a field bus connection interface for a standard field bus connection to a decentral input/output unit.

13 Claims, 6 Drawing Sheets

(56) References Cited

U.S. PATENT DOCUMENTS

Figure 1:
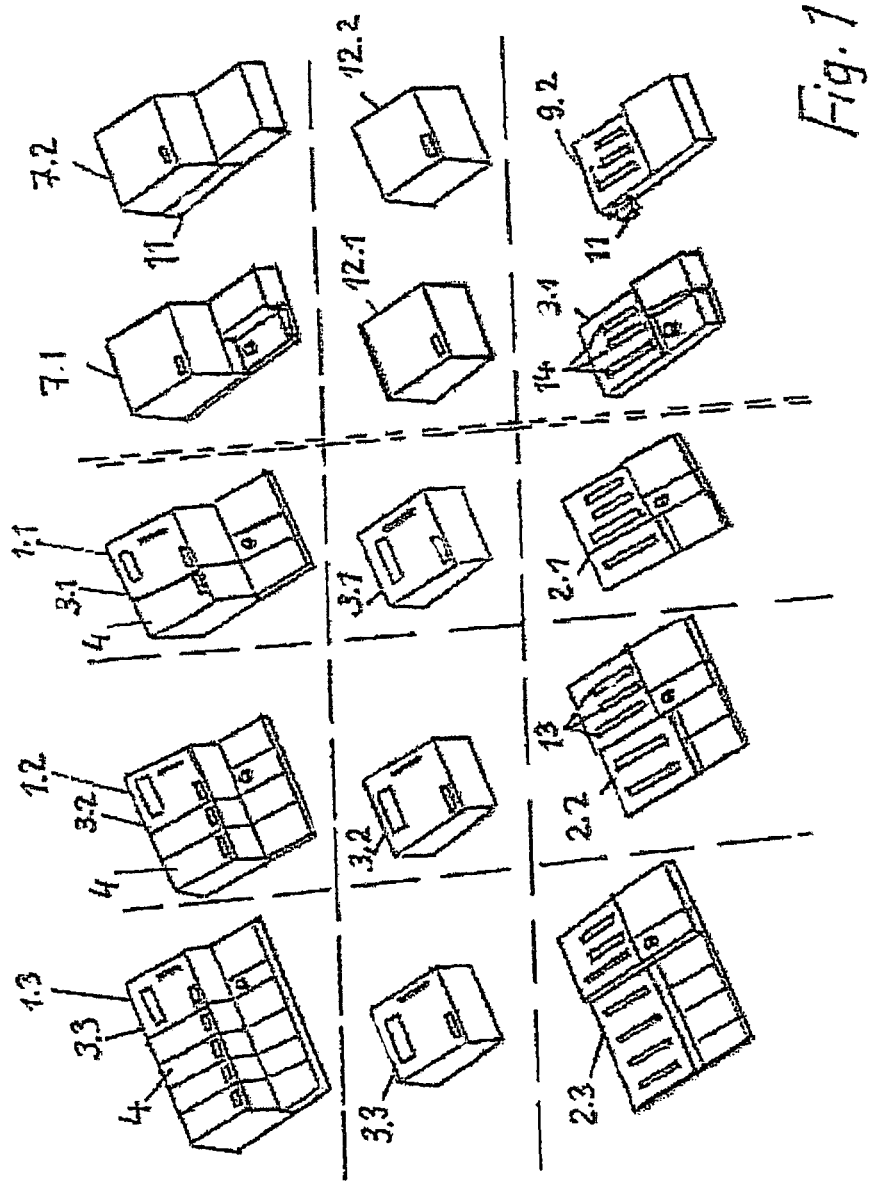

| | | | |
|---|---|---|---|
| 6,449,715 B1* | 9/2002 | Krivoshein | 713/1 |
| 6,452,785 B1 | 9/2002 | Kaaden et al. | |
| 6,738,830 B2* | 5/2004 | Massie | 710/2 |
| 6,881,101 B2* | 4/2005 | Sichner et al. | 439/717 |
| 7,239,509 B1* | 7/2007 | Roeske | 361/679.02 |
| 7,441,114 B2* | 10/2008 | Collier et al. | 713/152 |
| 2001/0056516 A1* | 12/2001 | Schollenberger | 710/305 |
| 2002/0013629 A1* | 1/2002 | Nixon et al. | 700/4 |
| 2004/0024939 A1 | 2/2004 | Hoeing et al. | |
| 2004/0141285 A1* | 7/2004 | Lefebvre et al. | 361/683 |
| 2004/0158653 A1* | 8/2004 | Aumer et al. | 710/8 |
| 2004/0184242 A1* | 9/2004 | Jones et al. | 361/724 |
| 2006/0069452 A1* | 3/2006 | Pfister et al. | 700/18 |
| 2006/0229746 A1* | 10/2006 | Ollis et al. | 700/65 |
| 2007/0066147 A1* | 3/2007 | Braunlich et al. | 439/717 |
| 2007/0112982 A1* | 5/2007 | Sichner et al. | 710/100 |
| 2008/0137284 A1* | 6/2008 | Flynn et al. | 361/685 |

FOREIGN PATENT DOCUMENTS

| | | |
|---|---|---|
| DE | 196 16 551 A1 | 10/1997 |
| DE | 19616551 A1 * | 10/1997 |
| DE | 297 16 575 U1 | 1/1998 |
| DE | 203 07 308 U1 | 8/2003 |
| EP | 0 499 675 B1 | 8/1992 |
| EP | 0 603 560 A1 | 6/1994 |

OTHER PUBLICATIONS

International Search Report for PCT/EP2005/012120 dated Mar. 29, 2006.

German Search Report for 10 2004 0560243.1 dated Mar. 30, 2004.

* cited by examiner

MODULAR AUTOMATION SYSTEM

The invention relates to a modular automation system which can be used in the field of industrial automation engineering and also in the field of circuit and control engineering.

Automation systems or automation devices as commercially available or described in patent documents are frequently defined as being modular in construction, offering flexibility of use or being expandable, whereas to a greater or lesser extent significant limitations are nonetheless specified in relation to these properties. For example, EP 0499675 B1 discloses a flexible automation system which, in a first configuration level, features a compact device alone. In a second configuration level, expansion is possible by means of expansion modules. If increased processing power is required in a third configuration level, the whole compact device must be replaced. Only previously added expansion modules can be reused. The expansion modules are connected to each other and to the new central device by means of multiwire ribbon cables.

The invention therefore addresses the problem of specifying an automation system which has increased modularity and expandability.

This problem is solved by an automation system having the features specified in claim 1. Advantageous embodiments are specified in further claims.

The invention therefore proposes an automation system in which a central automation device can be constructed and upgraded using one of a plurality of selectable and variously upgradable baseboards. The automation device can be upgraded using one of a plurality of central units which have differing data processing power and data storage capacities at the same time as having uniform external dimensions. At least one input/output device can be coupled directly to the central unit, though the central unit can also operate without an input/output device. The baseboards can be equipped with at least one communications coupler for a field bus connection to a decentral input/output unit.

The automation system according to the invention has a number of advantages:
- The basic configuration of the central automation device already includes a field bus connection interface which allows connection of peripheral devices via various standard field buses such as Profibus-DP, Modbus, etc.
- It is possible to increase the processing power and storage capacity without increasing the space requirement.
- Assembly and device replacement can be carried out quickly and easily, since a central or standalone automation device is formed by means of a baseboard, a central unit and optionally communication couplers being plugged onto said baseboard, and plugged-in input/output expansion devices. All of these system components are electrically connected together without cable connections. Decentral input/output units are also constructed in a similar manner, namely by means of so-called terminal blocks onto which it is possible to plug I/O interface modules and I/O expansion modules. A plurality of I/O expansion devices can be linked together in series, wherein an expansion bus is continued from one device to the next device via lateral plug connections in each case. Consequently, lines of a standard field bus are only required within the automation system in the case of decentralized input/output.
- Simple assembly is also ensured because the devices can be clipped onto a DIN rail and when pressed together are connected together by means of lateral snap-in entities.
- The central unit, communication couplers and I/O modules are simply plugged onto a baseboard or terminal blocks.
- Input/output devices of the central automation device and of the decentral input/output units are shaped uniformly and independently of the installed type of available central units. This inter alia results in a high level of reusability of modules in the case of a change to the system configuration.

Figure 2:
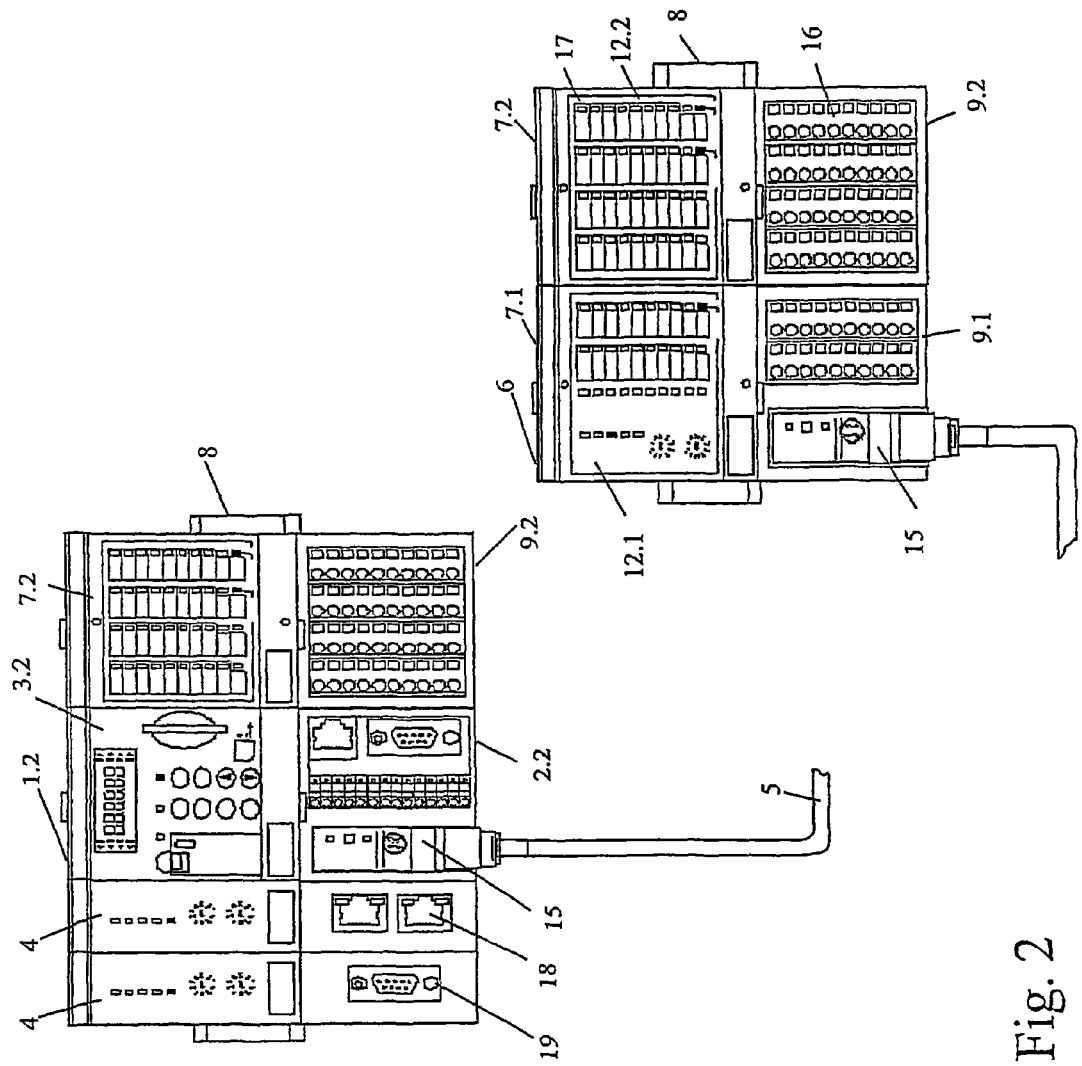
Figure 3:
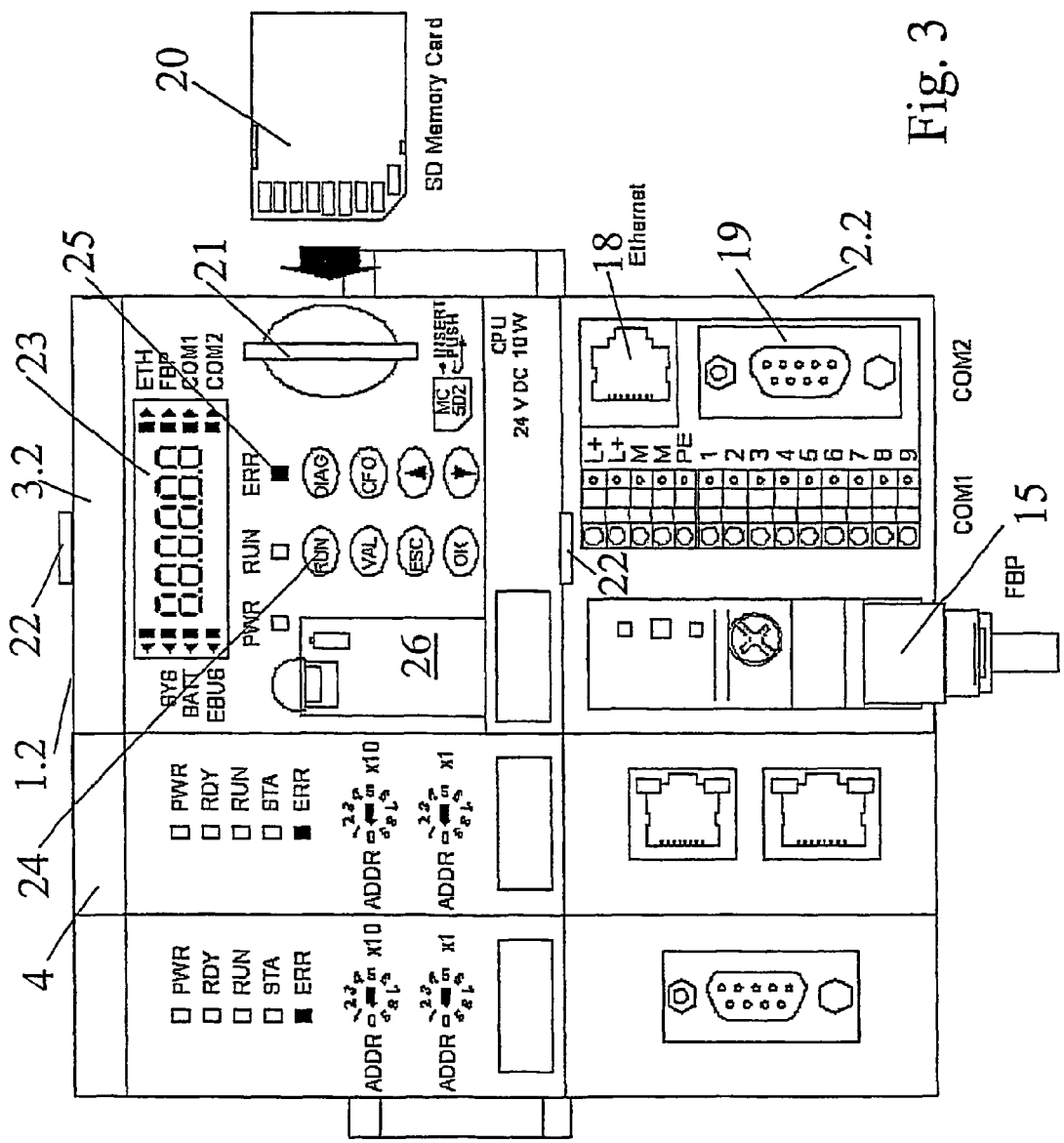
Figure 4:
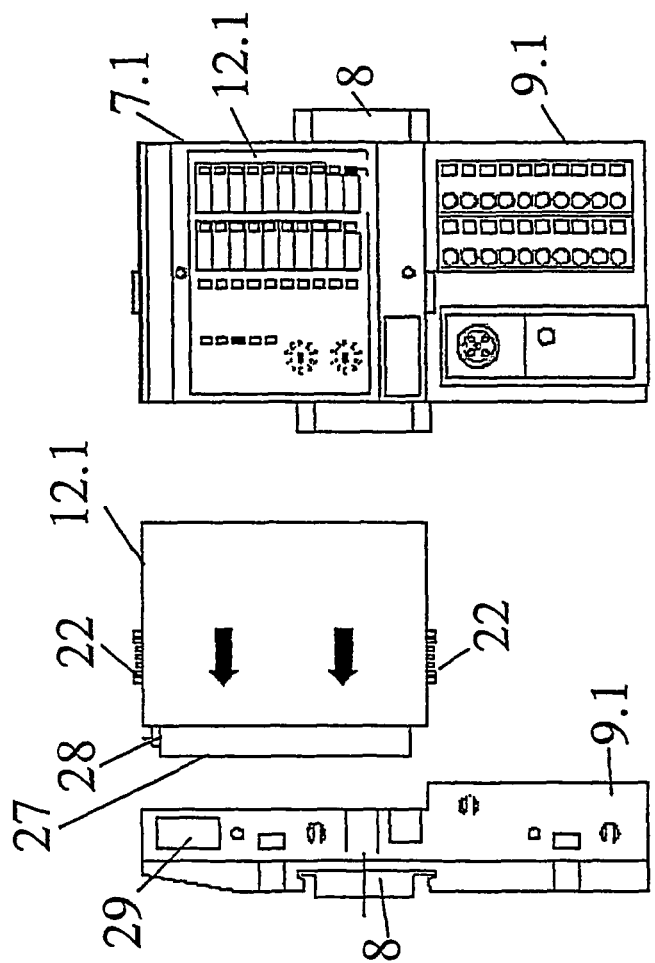
Figure 5:
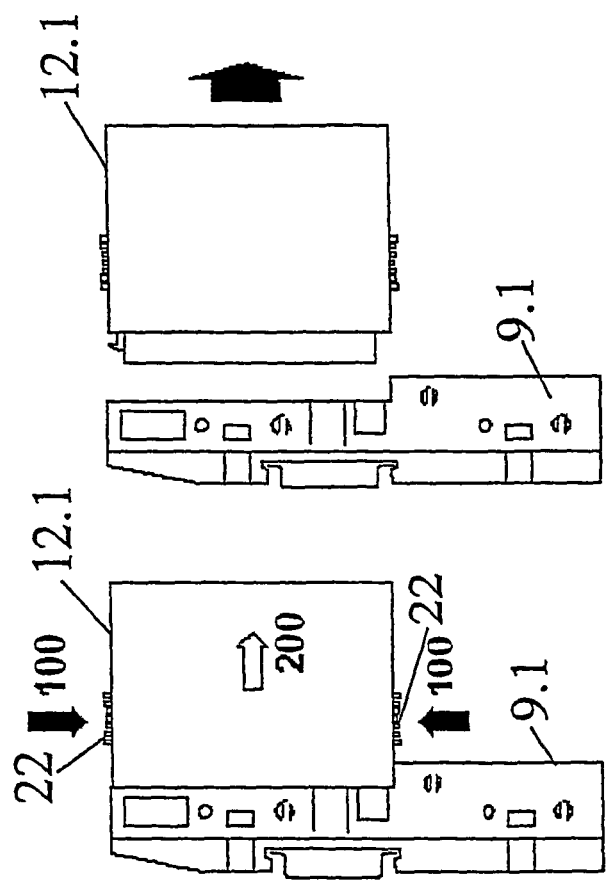
Figure 6:
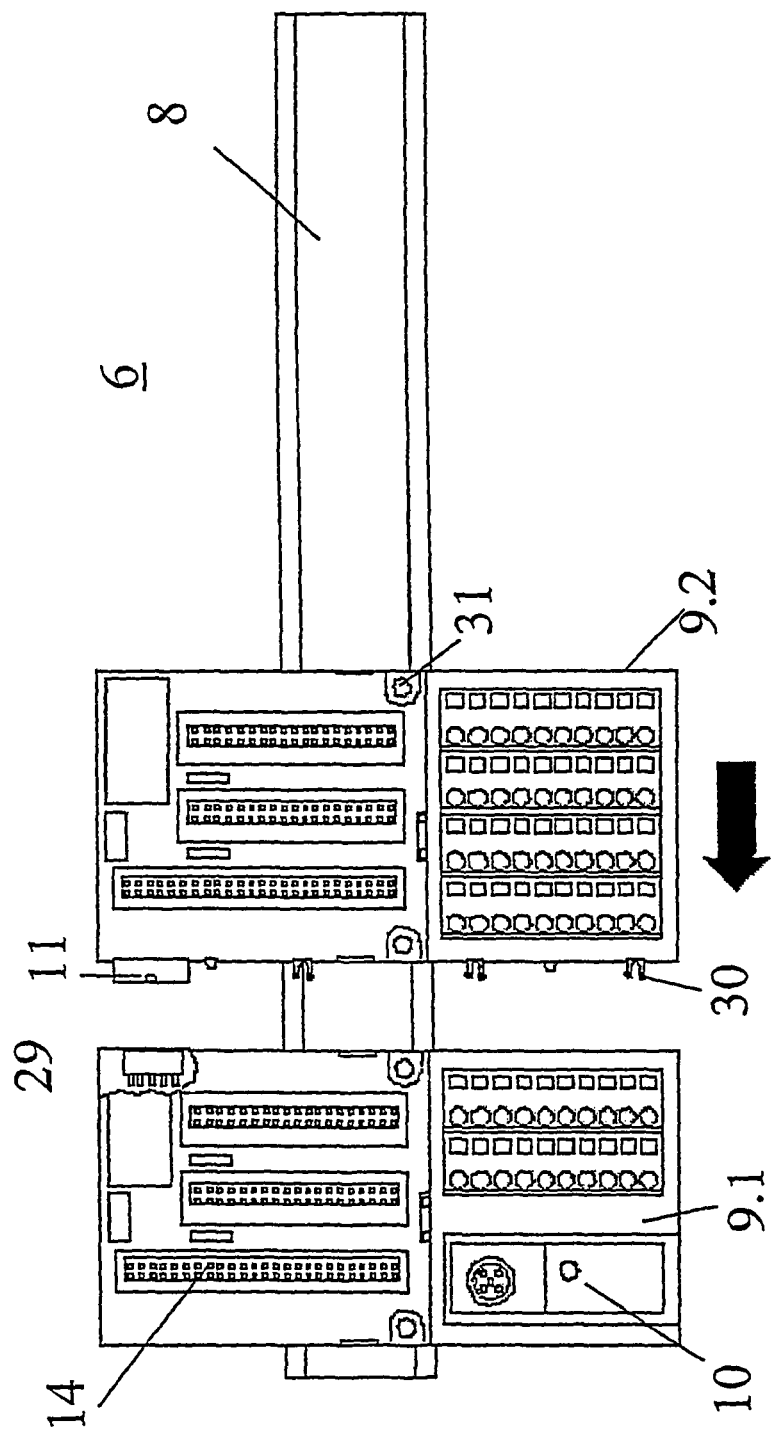

A further explanation of the invention and its advantages is given in the following description of an exemplary embodiment with reference to drawings, in which:

FIG. 1 shows an overview of a plurality of typical modules and automation device configurations of the automation system, FIG. 2 shows a possible system configuration with field bus, FIG. 3 shows a central automation device, FIGS. 4 and 5 show an input/output device, and FIG. 6 shows terminal blocks for input/output devices and expansion devices.

In a schematic and simplified illustration, in a left-hand area of the bottom row, FIG. 1 shows three exemplary baseboards 2.1, 2.2, 2.3 for the construction of a central automation device 1.1, 1.2, 1.3 as represented in the left-hand area of the top row. The smallest baseboard 2.1 is suitable for a planned final configuration having one of the central units (CPU) 3.1, 3.2, 3.3 as illustrated in the middle row and a communication coupler 4. The medium baseboard 2.2 allows the configuration having two communication couplers 4, and the largest baseboard 2.3 allows the configuration having four communication couplers 4. Each of the baseboards 2.1, 2.2, 2.3 can be equipped with any of the central units 3.1, 3.2, 3.3, wherein these do not differ in their external dimensions but do differ in respect of their processing power and storage capacity. Each of the base boards 2.1, 2.2, 2.3 is provided with multipin DIN plug connectors 13 for this purpose.

In a right-hand area of the bottom row, FIG. 1 shows two I/O terminal blocks 9.1, 9.2 which are used as baseboards for the construction of an input/output device 7.1 or an input/output expansion device 7.2. I/O terminal blocks 9.1 for input/output devices 7.1 have a field bus connection interface 10 for connection to one of the central automation devices 1.1-1.3. By contrast, I/O terminal blocks 9.2 for input/output expansion devices 7.2 have a lateral plug-type connection interface 11 for connection to an input/output device 7.1 or to one of the central automation devices 1.1-1.3 as explained below with reference to FIG. 2. An I/O module 12.1 or 12.2 which can be plugged onto the multipin DIN plug connector 14 on the relevant I/O terminal block 9.1 or 9.2 is required for the construction of an input/output device 7.1 or an input/output expansion device 7.2. Terminal blocks 9.1, 9.2 can be provided in different designs, e.g. featuring screw terminals or spring terminals and for different operating voltages. It is also possible to use I/O modules 12.1 or 12.2 of different designs, e.g. in the form of a digital or analog I/O module.

By way of example, FIG. 2 shows an automation system which has been configured using a selection of the modules shown in FIG. 1. In this case, an automation device 1.2 is utilized whose modules are clipped onto a standard DIN rail 8. Use is made of a baseboard 2.2 which is equipped with a central unit 3.2 and two communication couplers 4. Also plugged into the baseboard 2.2 is an I/O terminal block 9.2, onto which in turn is plugged an I/O expansion module 12.2. These plug possibilities are explained in greater detail below with reference to the illustrations in the FIGS. 4 to 6. The two communication couplers 4 are designed differently with respect to their connection interfaces, specifically having Ethernet connection interfaces 18 or a 9-pin serial connection interface 19.

A decentral input/output unit 6 is connected to the automation device 1.2 by means of a field bus plug connector 15 in each case and a field bus connection 5. The input/output unit 6 contains an I/O terminal block 9.1 with a plugged-on I/O interface module 12.1, i.e. an input/output device 7.1, and an I/O terminal block 9.2 with a plugged-on I/O expansion module 12.2, i.e. an input/output expansion device 7.2, wherein the terminal blocks 9.1, 9.2 are plugged together as shown in FIG. 6. The plugging-on of a module onto a terminal block is illustrated with reference to the FIGS. 4 and 5. Input/output devices 7.1 or input/output expansion devices 7.2 have in each case a terminal area 16 and a display area 17. The terminal area 16 contains both screw terminals and spring terminals. It is possible for further input/output expansion devices 7.2 to be plugged into input/output expansion devices 7.2. Input/output expansion devices 7.2 of the automation device 1.2 and the input/output unit 6 are uniformly designed, thereby ensuring flexibility of use and a reduction in the diversity of types. The construction of the I/O devices by means of a combination of terminal block and plugged-on I/O module has inter alia the advantage that I/O modules can be replaced without having to detach the wiring at the terminal block for this purpose.

FIG. 3 again shows the automation device 1.2 which was illustrated in FIG. 2, wherein however the input/output expansion device 7.2 is removed in order to show a data memory card 20 which can be plugged into a memory card holder 21 of the central unit 3.2. The central unit 3.2 is equipped with disengagement means 22, the operation of which allows the central unit 3.2 to be removed from the baseboard 2.2. A backlit LCD display 23 is present for various messages, LED indicators 25 are provided for direct status displays and a plurality of keys 24 are provided for settings. The cover of a battery slot is designated by 26.

Such a modular automation device including a central unit and a plurality of communication couplers can be used flexibly in different functions, e.g. as a bus master of a larger automation system, as a decentral processing entity in such a decentral larger automation system, as a standalone automation device in conjunction with the locally attachable input/output devices or as a central automation device of a system which is described here with reference to FIG. 2.

The right-hand side of FIG. 4 shows the front view of an input/output device 7.1, as illustrated in FIG. 2, consisting of terminal block 9.1 with plugged-on I/O interface module 12.1. Adjacent to this on the left is a side view of the terminal block 9.1 and the I/O interface module 12.1 which has not yet been plugged on. When the I/O interface module 12.1 is plugged on in the direction of the arrows, it engages in the terminal block 9.1 by means of snap-in elements 28. An electrical connection is also created in this case by means of plug-type strips 27 on the I/O interface module 12.1 and, as shown in FIG. 1, multipin DIN plug connectors 14 on the I/O interface module 12.1. An expansion bus plug socket is designated as 29.

FIG. 5 shows how the I/O interface module 12.1 can be removed by simultaneously pressing on the disengagement means 22 (as in the case of the central unit 3.2, cf. FIG. 3) in the direction of the arrows 100 and pulling in the direction of the arrow 200.

FIG. 6 shows terminal blocks 9.1 and 9.2 of an input/output unit 6. It is clear from the illustration that the terminal blocks 9.1, 9.2 can be plugged together by means of displacement along the standard DIN rail 8 in the direction of the arrow, and are locked by means of terminal block snap-in elements 30. An electrical plug-type connection for an expansion bus is also created via the plug-type connection interface 11 of the terminal block 9.2 and the expansion bus plug socket 29 of the terminal block 9.1, wherein said expansion bus represents an expansion of the field bus whose field bus plug connector can be connected to the field bus connection interface 10. The terminal blocks 9.1, 9.2 include electronic entities which are required for the expansion bus. Like the terminal block 9.1 of the input/output device 7.1 (cf. FIG. 4), the terminal block 9.2 for input/output expansion devices includes an expansion bus plug socket 29—not shown on block 9.2 in FIG. 6—by means of which the expansion bus can be continued to further input/output expansion devices. Openings 31 in the terminal blocks 9.1, 9.2 allow them to be screw-mounted onto a wall if a DIN rail is not used.

List of Reference Numerals

1.1, 1.2, 1.3 Automation device
2.1, 2.2, 2.3 Baseboard
3.1, 3.2, 3.3 Central unit
4 Communication coupler
5 Field bus connection
6 Input/output unit
7.1 Input/output device with FBP interface
7.2 Input/output expansion device
8 Standard DIN rail
9.1 Terminal block for input/output device
9.2 Terminal block for input/output expansion device
10 Field bus connection interface
11 Plug-type connection interface
12.1 Plug-in I/O interface module
12.2 Plug-in I/O expansion module
13 Multipin DIN plug connector for central unit
14 Multipin DIN plug connector for I/O module
15 Field bus plug connector
16 Terminal area
17 Display area
18 Ethernet connection interface
19 9-pin serial connection interface
20 Data memory card
21 Memory card holder
22 Disengagement means
23 LCD display
24 Keys
25 LED display
26 Cover for battery slot
27 Plug-type strips
28 Snap-in element
29 Expansion bus plug socket
30 Terminal block snap-in element
31 Opening

The invention claimed is:

1. A modular automation system for industrial automation technology, comprising:
  a central automation device including a central processing unit and one of a plurality of selectable and variously upgradeable baseboards,
  the central automation device being upgraded using one of a plurality of central processing units which have uniform external dimensions yet differing data processing power and data storage capacities, and
  at least one input/output expansion device including an input/output expansion module and an input/output terminal block, the input/output expansion device being directly coupled to the central automation device, wherein each of the selectable baseboards has a field bus connection interface for a standard field bus connection to a decentralized input/output unit, wherein the central automation device and the at least one input/output expansion device are electrically connected without cable connections via plug connections, the central automation device and the at least one input/output expansion device being directly connected via the plug connections without intervening components therebetween, and wherein the at least one input/output expansion device of the decentralized input/output unit includes a housing in which at least one input/output expansion module is housed, and a terminal block onto which an I/O module is pluggable within the housing by means of a detachable connection.

2. The automation system as claimed in claim 1, wherein a selected baseboard of the central automation device can be clipped onto a standard DIN rail, wherein the at least one input/output device can also be clipped onto the DIN rail and electrically and mechanically plugged into the selected baseboard.

3. The automation system as claimed in claim 1, wherein each baseboard can be equipped with at least one communication coupler for bus connections.

4. The automation system as claimed in claim 1, wherein decentralized input/output units in each case feature an input/output device with a field bus connection interface, wherein at least one input/output expansion device can be connected to the input/output device.

5. The automation system as claimed in claim 4, wherein the devices of an input/output unit in each case feature a terminal block onto which an I/O module can be plugged in each case.

6. The automation system as claimed in claim 4, wherein the input/output device is connected to an input/output expansion device, and input/output expansion devices are connected to each other, via plug-type connections for carrying signals of an expansion bus.

7. The automation system as claimed in claim 1, wherein components of a decentralized automation device and components of an input/output unit are configured to be electrically connected to each other without cables via plug-type connections.

8. The automation system as claimed in claim 7, wherein the components of the decentralized automation device and the components of the input/output unit additionally are configured to be in each case detachably connected to each other by means of plug-type means and/or snap-in means.

9. The automation system as claimed in claim 2, wherein each baseboard is equipped with at least one communication coupler for bus connections.

10. The automation system as claimed in claim 3, wherein decentralized input/output units in each case feature an input/output device with a field bus connection interface, wherein at least one input/output expansion device can be connected to the input/output device.

11. The automation system as claimed in claim 5, wherein the input/output device is connected to an input/output expansion device, and input/output expansion devices are connected to each other, via plug-type connections for carrying signals of an expansion bus.

12. The automation system as claimed in claim 6, wherein components of a decentralized automation device and all components of an input/output unit are configured to be electrically connected to each other without cables via plug-type connections.

13. A modular automation method for industrial automation technology, comprising:

a) constructing a central automation device to include a central processing unit and at least one of a plurality of selectable and upgradeable baseboards, b) upgrading the central automation device using one of plural central processing units which have uniform external dimensions yet different data processing power and data storage capacities, and c) directly coupling at least one input/output expansion device to the central automation device, the at least one input/output expansion device including an input/output expansion module and an input/output terminal block, wherein each of the selectable baseboards comprises a field bus connection interface used for a standard field bus connection to a decentralized input/output unit, wherein the central automation device and the at least one input/output expansion device are electrically connected without cable connections wirelessly via plug connections, the central automation device and the at least one input/output expansion device being directly connected via the plug connections without intervening components therebetween, and wherein the at least one input/output expansion device of the decentralized input/output unit includes a housing in which at least one input/output expansion module is housed, and a terminal block onto which an I/O module is pluggable within the housing by means of a detachable connection.

\* \* \* \* \*